United States Patent [19]

Ewaldt et al.

[11] Patent Number: 4,462,019

[45] Date of Patent: Jul. 24, 1984

[54] PHOTOSENSITIVE SEMICONDUCTOR RESISTOR

[75] Inventors: Helmut Ewaldt; Gerhard Raabe, both of Hamburg; Heinz Sauermann, Halstenbek; Rainer Burmeister, Hamburg, all of Fed. Rep. of Germany

[73] Assignee: U.S. Philips Corporation, New York, N.Y.

[21] Appl. No.: 344,688

[22] Filed: Feb. 1, 1982

[30] Foreign Application Priority Data

Feb. 6, 1981 [DE] Fed. Rep. of Germany ....... 3104075

[51] Int. Cl.$^3$ ............................................ H01L 31/08
[52] U.S. Cl. ........................................ 338/15; 357/30; 250/211 K
[58] Field of Search ............................ 338/15; 357/30; 356/213; 250/211 K

[56] References Cited

U.S. PATENT DOCUMENTS 2,805,347  9/1957  Haynes et al. ........................ 357/30
3,660,733  5/1972  Vilf et al. ................................. 357/1

OTHER PUBLICATIONS

N. Sclar, "Properties of High Performance Background Limited P Type Si:Zn Photoconductors," Mar. 1981—Solid State Electronics, pp. 203-204, 210.

Deboo, Burrous, *Integrated Circuits & Semiconductor Devices Theory & Applications*, 1977, pp. 316-322.

*Primary Examiner*—B. A. Reynolds
*Assistant Examiner*—Christopher Sears
*Attorney, Agent, or Firm*—Robert T. Mayer; Steven R. Biren

[57] ABSTRACT

A photosensitive semiconductor resistor has a monocrystalline semiconductor body of one conductivity type which, on two oppositely located surfaces, is provided with an anode contact and with a cathode contact, and is constructed so that the cathode contact is a highly doped zone of the same conductivity type as the semiconductor body. The semiconductor body can be exposed to photon radiation at its surface supporting the cathode contact and the area of the anode contact is at least 1000 times larger than the area of the cathode contact. Such a photosensitive semiconductor resistor is easy to manufacture and has both a low inertia and a good sensitivity.

8 Claims, 3 Drawing Figures

PHOTOSENSITIVE SEMICONDUCTOR RESISTOR

BACKGROUND OF THE INVENTION

The invention relates to a photosensitive semiconductor resistor having a monocrystalline semiconductor body of one conductivity type which, on two oppositely located surfaces, is provided with an anode contact and with a cathode contact.

A semiconductor resistor of this type is known, for example, from the publication "Sensoren" of Philips GmbH, Hamburg 1980, pp 29-31.

Photosensitive semiconductor resistors are normally manufactured from a polycrystalline material, usually CdS. However, such resistors are comparatively inert.

Photosensitive semiconductor resistors of a monocrystalline semiconductor material, such as silicon or germanium, on the contrary, so far were comparatively insensitive and difficult to manufacture.

SUMMARY OF THE INVENTION

It is the object of the invention to provide a photosensitive semiconductor resistor of the kind mentioned above in such manner that it can be manufactured in a simple manner by means of the planar technology which is usual in the manufacture of semiconductor components in such manner as to have a small inertia and a good sensitivity.

The invention is based on the recognition of the fact that the desired electric properties can be achieved when the contact area of the cathode contact is substantially smaller than the contact area of the anode contact.

According to the invention this object is achieved in that the cathode contact is a highly doped surface zone of the same conductivity type as the semiconductor body in the semiconductor body and that the area of the anode contact is at least 1000 times larger than the cathode contact which contacts the semiconductor body at the surface to be exposed to photon radiation.

The advantages achieved with such a construction of the semiconductor resistor reside in particular in that it is easy and economic to manufacture and has a good radiation sensitivity with low inertia.

The semiconductor body preferably is of silicon; however, germanium or an intermetallic compound may also be used.

The semiconductor body preferably is n-conductive and the cathode and anode contacts are formed by N+-doped zones.

The resistivity of the semiconductor body should be larger than 100 $\Omega$cm; an effective value is 2000 $\Omega$cm.

In order to make the photosensitivity of the semiconductor resistor as large as possible, the volume lifetime of the minority charge carriers in the semiconductor body preferably is larger than 100 $\mu$s.

In order to ensure that the photon radiation incident on the semiconductor resistor is optimally used as much as possible, the area of the surface supporting the cathode contact and exposed to the radiation should be so large as compared with the area of the cathode contact that the value of the current generated in the semiconductor body by the photon radiation achieves approximately 70% of the saturation value.

An embodiment of a photosensitive semiconductor resistor according to the invention will be described in greater detail with reference to the accompanying drawings.

DESCRIPTION OF PREFERRED EMBODIMENTS

Figure 1:
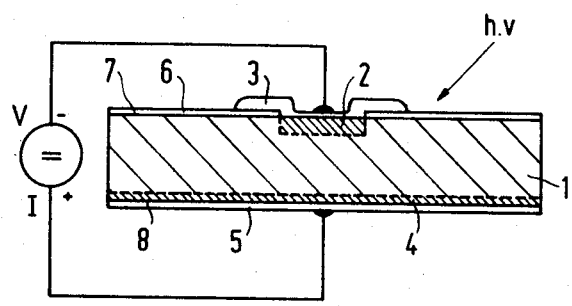
FIG. 1 is a sectional view through a photosensitive semiconductor resistor according to the invention.

FIG. 1 is a sectional view through a photosensitive semiconductor resistor according to the invention. The dimensions in the direction of thickness are considerably exaggerated. The semiconductor resistor has a monocrystalline semiconductor body, preferably of silicon, which, on its surface 7 is exposed to the photoradiation hv and is covered with a radiation-permeable passivating layer 6, and supports a cathode contact 2 which consists of readily-conductive zone diffused in the semiconductor body and of the same conductivity type as the semiconductor body. The surface of said zone comprises a connection metallization 3 extending over the passivating layer 6, the area of which, however, is kept as small as possible so as to leave the part of the surface 7 exposed to the photon radiation hv as large as possible.

The monocrystalline semiconductor body 1 comprises on its lower surface 8 an anode contact 4 which includes a highly doped layer provided in the semiconductor body. The surface of this layer is also covered with a connection metallization 5.

The areas of the cathode contact 2 and the anode contact 4 have been chosen to be such that the area of the anode contact 4 is at least 1000 times larger than the area of the cathode contact 2.

When the photosensitive semiconductor resistor shown in FIG. 1 is exposed to radiation, hole-electron pairs are generated in the proximity of the cathode contact 2 and the holes migrate as minority charge carrier to said cathode contact. The minority charge carriers have a lifetime in the order of magnitude of $10^{-3}$s and the probability of reaching the cathode contact 2 is large since as a result of the large, field strength prevailing in the proximity of the cathode contact 2, they have a large drift velocity. The electrons as majority charge carriers migrate through the semiconductor body to the large-area anode contact 4. The electric neutrality of the device is ensured by the ionized impurities.

When the photosensitive semiconductor resistor has a small cathode contact and a large anode contact, the probability is great that a hole-electron pair generated by incident photon radiation will provide an additional charge carrier to the overall current; the semiconductor resistor hence reduces its resistance value when radiation is incident.

When the polarity is reversed, that is to say when in the semiconductor resistor shown in FIG. 1 the positive terminal of the voltage source is connected to the small contact 2 and the negative terminal is connected to the large contact 4, the hole-electron pairs generated by incident photons will recombine again at the place of origin, since no holes could flow from the small contact 2; it is highly undoped, hence it provides no holes and a separation of the hole-electron pairs would not result in nonpermitted space charges.

So with such a polarization an influence of incident photon radiation of the resistance value of the semiconductor resistor can not be established.

When the semiconductor body is p-conductive (with p+ contacts) *the polarity of the voltage U should be correspondingly reversed.*

With a photosensitive semiconductor resistor of the kind described, the ratio between its dark resistance and its resistance during irradiation is directly proportional to the resistivity of the semiconductor body 1
to the lifetime $\tau_p$ of the minority charge carriers in the semiconductor body 1
to the radiation intensity B and inversely proportional
to the applied voltage v
to the area of the cathode contact 2

In a practical embodiment, the semiconductor body is of n-conductive silicon having a resistivity of approximately 2000 Ωcm. The volume lifetime of the minority charge carriers in the semiconductor body is larger than 100 μs. The anode and cathode contacts are formed by N+ doped zones. The semiconductor body 1 has an area f of approximately 3 mm² (1700 μm×1700 μm) and a thickness of 250 μm. The cathode contact 2 has a diameter of 20 μm and hence an area of approximately $3\times10^{-4}$ mm².

Figure 2:
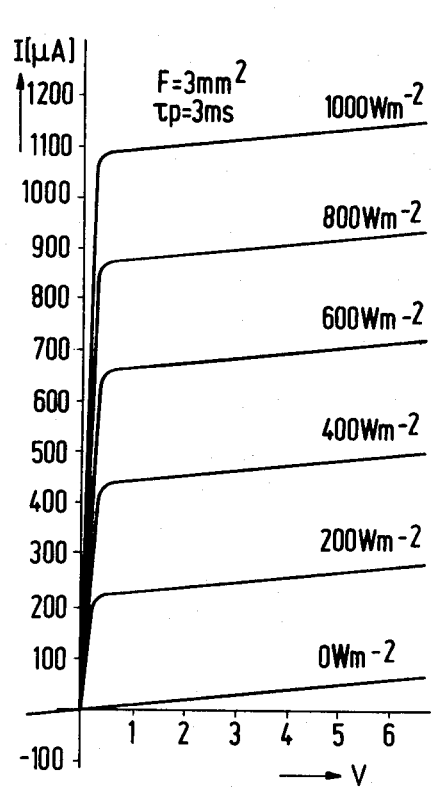
FIG. 2 shows a I-V characteristic of the semiconductor resistor shown in FIG. 1 with the radiation intensity as a parameter.

When a voltage V is applied to such a photosensitive semiconductor body and when it is exposed to a photon radiation hv having a radiation intensity B, the I-V characteristics shown in FIG. 2 are obtained with the radiation intensity B as a parameter.

The semiconductor resistor has a dark resistance of approximately 100 kOhm and a resistance during irradiation (with radiation intensity of 1000 Wm⁻² and an applied voltage of 1 V) of approximately 1000 Ohm.

Figure 3:
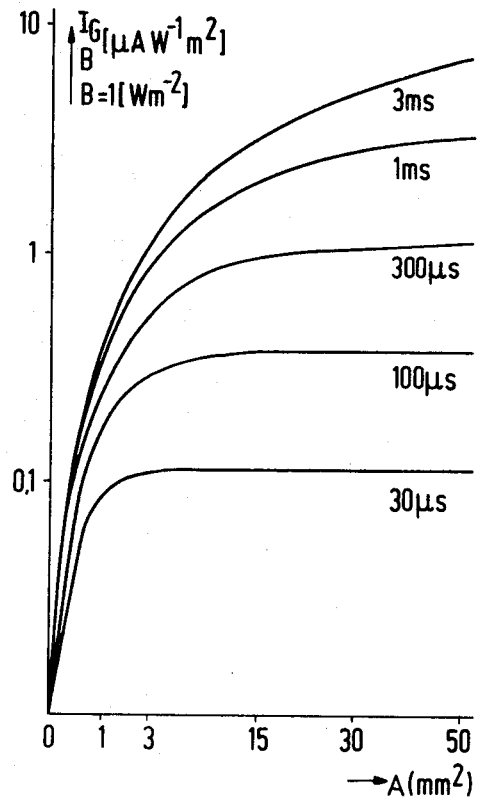
FIG. 3 is a diagram showing the dependence of the current generated in the semiconductor resistor shown in FIG. 1 on the value of its area exposed to the radiation, with the charge carrier lifetime as a parameter.

FIG. 3 shows the dependence of the current $I_G$ generated in the semiconductor resistor shown in FIG. 1 on the size of the area exposed to the radiation. In practical operation the dark current is added to the overall current I to provide the current $I_G$. The current $I_G$ is standardized in FIG. 3 on an irradiation intensity of 1 Wm⁻². Parameter is the lifetime $\tau_p$ of the minority charge carriers in the semiconductor body 1.

As with the values according to FIG. 2, the wavelength of the incident photon radiation is 0.6 μm.

The diagram shows that the generated current-and hence also the current during irradiation-increases with the charge carrier lifetime and the area exposed to the radiation. It appears that- with a given area of the cathode contact 2—a saturation value for the current $I_G$ is soon achieved. So it is efficacious to make the area F exposed to the radiation only so large that the saturation value is reached to an approximation (for example to 70%).

A photosensitive semiconductor resistor according to FIG. 1 can be manufactured as follows:

The starting material is a monocrystalline silicon disc which is oriented in the 111 direction and which has a resistivity of 2000 Ωcm and a volume lifetime of the minority charge carriers exceeding 100 μs. The semiconductor disc with a thickness of 250 μm is polished on one side and is then covered with a thermal oxide of 0.8 μm thickness. By means of a photomasking step a hole of approximately 20 μm diameter for each semiconductor resistor is provided in the thermal oxide layer on the upper side of the semiconductor layer. As a result of the etching step necessary for that purpose the thermal oxide grown on the rear side of the disc is also removed.

In a successive diffusion step, N+ conductive zones of approximately 1.5μ depth are then generated through the holes in the oxide layer and simultaneously on the overall rear side by indiffusion of phosphorus with a surface concentration of approximately $0.9\times10^{21}$ atoms/cm³ for more than 30 minutes at 1000° C. This diffusion step simultaneously has a gettering effect and improves the volume lifetime of the minority charge carriers in the semiconductor body.

The surfaces of the indiffussed N+ zones in the holes of the oxide layer on the upper side of the disc are then exposed by removing the phosphor glass formed during the diffusion and are then contacted by vapor deposition of connection metallizations of aluminum of approximately 80 μm diameter. On the rear side of the semiconductor disc a connection metallization of gold-arsenic is also vapor-deposited and alloyed.

The disc is then severed into individual chips of approximately 1700 μm×1700 μm forming the actual semiconductor resistors which are then assembled and contacted in a suitable photon-radiation passing envelope, the envelope being formed so that the surface of the resistance body supporting the cathode contact 2 can be exposed to a photon radiation.

What is claimed is:

1. A photosensitive semiconductor resistor having a monocrystalline semiconductor body of one conductivity type, which on two oppositely-located surfaces is provided with an anode contact and with a cathode contact, is characterized in that the cathode contact is a highly doped surface zone in the semiconductor body and of the same conductivity type as the semiconductor body, and that the area of the anode contact is at least 1000 times larger than the area of the cathode contact, said cathode contact contacting the semiconductor body at the surface to be exposed to photon radiation.

2. A semiconductor resistor as claimed in claim 1, characterized in that the semiconductor body comprises silicon.

3. A semiconductor resistor as claimed in claim 1 or 2, characterized in that the semiconductor body is N-conductive and that the cathode contact and the anode contact are formed by N+ doped zones of the semiconductor body.

4. A semiconductor resistor as claimed in claim 3, characterized in that the cathode contact and the anode contact are provided with connection metallizations.

5. A semiconductor resistor as claimed in claim 1, characterized in that the resistivity of the semiconductor body exceeds 100 Ωcm.

6. A semiconductor resistor as claimed in claim 5, characterized in that the resistivity of the semiconductor body is approximately 2000 Ωcm.

7. A semiconductor resistor as claimed in claim 1, characterized in that the volume lifetime of the minority charge carriers in the semiconductor body exceeds 100 μs.

8. A semiconductor resistor as claimed in claim 1 or 2, characterized in that the area of the parts of the surface-area supporting the cathode contact and exposed to the photon radiation is so large as compared with the area of the cathode contact that the value of the current generated in the semiconductor body by the photon radiation reaches approximately 70% of the saturation value.

* * * * *